(12) United States Patent
Chang et al.

(10) Patent No.: US 10,784,167 B2
(45) Date of Patent: Sep. 22, 2020

(54) ISOLATION COMPONENTS FOR TRANSISTORS FORMED ON FIN FEATURES OF SEMICONDUCTOR SUBSTRATES

(71) Applicant: Marvell World Trade Ltd., St. Michael (BB)

(72) Inventors: Runzi Chang, San Jose, CA (US); Chuan-Cheng Cheng, Fremont, CA (US)

(73) Assignee: MARVELL ASIA PTE, LTD., Singapore (SG)

( * ) Notice: Subject to any disclaimer, the term of this patent is extended or adjusted under 35 U.S.C. 154(b) by 0 days.

(21) Appl. No.: 16/230,505

(22) Filed: Dec. 21, 2018

(65) Prior Publication Data
US 2019/0148236 A1 May 16, 2019

Related U.S. Application Data

(60) Continuation of application No. 15/211,256, filed on Jul. 15, 2016, now Pat. No. 10,217,669, which is a
(Continued)

(51) Int. Cl.
*H01L 21/76* (2006.01)
*H01L 21/8234* (2006.01)
(Continued)

(52) U.S. Cl.
CPC .......... *H01L 21/823431* (2013.01); *H01L 21/28035* (2013.01); *H01L 21/764* (2013.01);
(Continued)

(58) Field of Classification Search
CPC ....... H01L 21/823431; H01L 21/28035; H01L 27/1211; H01L 21/764; H01L 21/845;
(Continued)

(56) References Cited

U.S. PATENT DOCUMENTS

| 6,891,235 | B1 * | 5/2005 | Furukawa ......... | H01L 21/26586 |
| | | | | 257/408 |
| 7,655,991 | B1 | 2/2010 | Nayak et al. | |

(Continued)

FOREIGN PATENT DOCUMENTS

| CN | 101960572 | 1/2011 |
| CN | 102034761 | 4/2011 |

(Continued)

OTHER PUBLICATIONS

"Advisory Action", U.S. Appl. No. 14/051,299, dated Jun. 29, 2016, 4 pages.

(Continued)

*Primary Examiner* — Mohammad M Hoque

(57) ABSTRACT

In an embodiment, a method comprises: forming a fin feature on a portion of a surface of a substrate; forming a first region of polycrystalline silicon over a first portion of the fin feature; forming a second region of polycrystalline silicon over a second portion of the fin feature; forming a third region of polycrystalline silicon over a third portion of the fin feature, wherein the third region of polycrystalline silicon is disposed between (i) the first region and (ii) the second region; forming a first spacer region between the first region and the third region; forming a second spacer region between the second region and the third region; removing the third region and at least a portion of the fin feature formed under the third region to thereby form a gap; and disposing a second dielectric material into the gap to form an isolation component.

20 Claims, 6 Drawing Sheets

Related U.S. Application Data division of application No. 14/051,299, filed on Oct. 10, 2013, now abandoned.

(60) Provisional application No. 61/713,990, filed on Oct. 15, 2012.

(51) Int. Cl.
| | |
|---|---|
| *H01L 27/088* | (2006.01) |
| *H01L 29/66* | (2006.01) |
| *H01L 21/84* | (2006.01) |
| *H01L 21/762* | (2006.01) |
| *H01L 21/764* | (2006.01) |
| *H01L 27/12* | (2006.01) |
| *H01L 21/28* | (2006.01) |

(52) U.S. Cl.
CPC ...... *H01L 21/76224* (2013.01); *H01L 21/845* (2013.01); *H01L 27/0886* (2013.01); *H01L 27/1211* (2013.01); *H01L 29/66795* (2013.01)

(58) Field of Classification Search
CPC ......... H01L 21/76224; H01L 29/66795; H01L 27/0886
USPC ........................................................ 257/401
See application file for complete search history.

(56) References Cited

U.S. PATENT DOCUMENTS

| | | | |
|---|---|---|---|
| 8,592,915 B2* | 11/2013 | Huang | H01L 21/02321 257/288 |
| 9,136,274 B2 | 9/2015 | Nam | |
| 10,217,669 B2 | 2/2019 | Chang et al. | |
| 2006/0289900 A1* | 12/2006 | Thirupapuliyur | H01L 21/823807 257/254 |
| 2007/0034947 A1 | 2/2007 | Loechelt et al. | |
| 2007/0054448 A1 | 3/2007 | Choi et al. | |
| 2008/0083956 A1 | 4/2008 | Mise et al. | |
| 2008/0166847 A1 | 7/2008 | Utomo et al. | |
| 2008/0197362 A1 | 8/2008 | Hisamoto et al. | |
| 2009/0061568 A1 | 3/2009 | Bangsaruntip et al. | |
| 2009/0224357 A1 | 9/2009 | Juengling | |
| 2009/0251946 A1 | 10/2009 | Juengling | |
| 2010/0200916 A1 | 8/2010 | Gossner et al. | |
| 2011/0079836 A1 | 4/2011 | Lin | |
| 2011/0084340 A1* | 4/2011 | Yuan | H01L 21/76224 257/368 |
| 2011/0127610 A1 | 6/2011 | Lee et al. | |
| 2011/0147847 A1 | 6/2011 | Cea et al. | |
| 2011/0260282 A1 | 10/2011 | Kawasaki | |
| 2012/0013022 A1 | 1/2012 | Sabuncuoglu Tezcan et al. | |
| 2012/0126884 A1 | 5/2012 | Juengling | |
| 2012/0292782 A1 | 11/2012 | Lee et al. | |
| 2013/0161729 A1 | 6/2013 | Xie | |
| 2013/0161756 A1* | 6/2013 | Glass | H01L 27/1211 257/369 |
| 2013/0175618 A1 | 7/2013 | Cheng et al. | |
| 2014/0001569 A1 | 1/2014 | Hafez et al. | |
| 2014/0003114 A1 | 1/2014 | Pellizzer et al. | |
| 2014/0015054 A1 | 1/2014 | Leobandung et al. | |
| 2014/0027857 A1 | 1/2014 | Yin et al. | |
| 2014/0035055 A1 | 2/2014 | Shinohara et al. | |
| 2014/0103452 A1 | 4/2014 | Chang et al. | |
| 2014/0353763 A1* | 12/2014 | Chung | H01L 21/823431 257/390 |
| 2015/0054089 A1* | 2/2015 | Hong | H01L 21/762 257/401 |
| 2015/0294969 A1* | 10/2015 | Lee | H01L 27/0886 257/401 |
| 2015/0380411 A1 | 12/2015 | Yin et al. | |
| 2016/0329249 A1 | 11/2016 | Chang | |

FOREIGN PATENT DOCUMENTS

| | | |
|---|---|---|
| CN | 102044469 | 5/2011 |
| WO | 2014062486 | 4/2014 |

OTHER PUBLICATIONS

"Final Office Action", U.S. Appl. No. 14/051,299, dated Apr. 15, 2016, 17 pages.
"Foreign Office Action", CN Application No. 201380053697.2, dated Jan. 25, 2017, 17 pages.
"Foreign Office Action", CN Application No. 201380053697.2, dated Oct. 17, 2017, 17 pages.
"International Search Report and Written Opinion", PCT Application No. PCT/US2013/064459, dated Mar. 18, 2014, 17 pages.
"Non-Final Office Action", U.S. Appl. No. 15/211,256, dated Jan. 26, 2018, 17 pages.
"Non-Final Office Action", U.S. Appl. No. 14/051,299, dated Apr. 10, 2015, 13 pages.
"Non-Final Office Action", U.S. Appl. No. 14/051,299, dated Nov. 19, 2015, 17 pages.
"Notice of Allowance", U.S. Appl. No. 15/211,256, dated Sep. 5, 2018, 11 pages.
"Preliminary Report on Patentability", PCT Application No. PCT/US2013/064459, dated Apr. 21, 2015, 12 pages.
"Restriction Requirement", U.S. Appl. No. 14/051,299, dated Jan. 2, 2015, 7 pages.

\* cited by examiner

ISOLATION COMPONENTS FOR TRANSISTORS FORMED ON FIN FEATURES OF SEMICONDUCTOR SUBSTRATES

CROSS-REFERENCE TO RELATED APPLICATION

This application is a continuation of U.S. patent application Ser. No. 15/211,256, filed Jul. 15, 2016, which is a divisional of and claims priority to U.S. patent application Ser. No. 14/051,299, filed Oct. 10, 2013, which claims priority to U.S. Provisional Patent Application No. 61/713,990, filed Oct. 15, 2012, which are incorporated herein by reference.

TECHNICAL FIELD

This disclosure relates to the formation of transistors from semiconductor materials. More specifically, this disclosure relates to the formation of field effect transistors (FETs) having a gate formed on a fin feature extending from a semiconductor substrate with an isolation component formed between the field effect transistors, where the isolation component has minimal dimensions.

BACKGROUND

In some cases, transistors can be formed from a semiconductor substrate that has a fin feature extending from a surface of the semiconductor substrate. The fin feature can extend substantially perpendicular to a planar surface of the semiconductor substrate. The fin feature can also have a thickness that is less than the thickness of the semiconductor substrate. Thus, by extending from a surface of the semiconductor substrate and having a thickness less than a thickness of the semiconductor substrate, the fin feature may resemble a "fin" extending above the surface of the semiconductor substrate. Respective gates of the transistors can be formed by disposing a material, such as a polycrystalline silicon (also referred to herein as "polysilicon"), on multiple surfaces of the fin feature. For example, the gates of the transistors can be formed by encasing a portion of the fin in polysilicon. Additionally, the source regions and the drain regions of the transistors can be formed from doped regions of the fin feature. In particular embodiments, gates of multiple transistors can be formed around a single fin feature. In these scenarios, the transistors can be electrically isolated to decrease interference between the transistors and minimize delays that may occur when the transistors change states.

In some cases, transistors formed from semiconductor substrates having fin features have been isolated using a number of techniques. In one example, the transistors have been isolated by placing an isolation gate between the transistors. In this example, the isolation gates include electrical features that are coupled to a supply voltage and/or a drain voltage. The connection of the isolation gates to electrical features of an integrated circuit can result in a parasitic capacitance that causes a delay in the response of the transistors to a state change. Further, the area covered by the isolation gates can be relatively large.

In another example, transistors formed from substrates having fin features can be isolated by performing a fin cut to cut through the fin feature between the transistors. The size of the fin cut is often limited because of lithographic techniques and has a width that is 30 nm or greater, which decreases the density of transistors formed on the substrate. Furthermore, the fin cut can remove contact between the polysilicon and the fin, which can inhibit the process for embedding stressors in the semiconductor substrate, such as SiGe and/or SiC, which are used to increase the performance of the transistors.

In still another example, regions of polysilicon can be placed at the ends of transistors after the fin cut is performed to create a polysilicon connection with the fins in order to facilitate the processes used to embed the stressors into the substrate. However, the regions formed using this technique have widths limited by 2-D lithography resolution (for example, at least 74 nm in some FinFET technologies), which reduces the density of transistors formed on the substrate.

SUMMARY

In accordance with an embodiment, an apparatus includes a substrate including a surface, and the surface includes a planar portion and a fin feature extending in a direction substantially perpendicular to the planar portion. The fin feature has a thickness less than a thickness of the substrate. The apparatus also includes a first transistor that includes a first gate region formed over the fin feature, a first source region formed from a body of the fin feature, and a first drain region formed from the body of the fin feature. Additionally, the apparatus includes a second transistor that includes a second gate region formed over the fin feature, a second source region formed from the body of the fin feature, and a second drain region formed from the body of the fin feature. Further, the apparatus includes an isolation component formed between the first transistor and the second transistor. The isolation component has a width less than 30 nm.

Additionally, in accordance with an embodiment, an apparatus includes a substrate having a surface that includes a planar portion and a fin feature extending in a direction substantially perpendicular to the planar portion. The fin feature has a thickness less than a thickness of the substrate. The apparatus also includes a layer formed over the planar portion of the surface of the substrate, where the layer includes a first dielectric material. In addition, the apparatus includes a first transistor having a first gate region disposed on at least two sides of the fin feature, a first source region formed from a body of the fin feature, and a first drain region formed from the body of the fin feature. Further, the apparatus includes a second transistor having a second gate region formed on the at least two sides of the fin feature, a second source region formed from the body of the fin feature, and a second drain region formed from the body of the fin feature. The apparatus also includes an isolation component formed between the first transistor and the second transistor. The isolation component includes a second dielectric material that is different from the first dielectric material.

Further, in accordance with an embodiment, a method includes forming a fin feature on a portion of a surface of a substrate including silicon, where the fin feature extends in a direction perpendicular to a planar portion of the surface of the substrate and has a thickness less than a thickness of the substrate, and the method includes forming a first region of polycrystalline silicon over a first portion of the fin feature of the substrate. The method also includes forming a second region of polycrystalline silicon over a second portion of the fin feature of the substrate and forming a third region of polycrystalline silicon over a third portion of the fin feature of the substrate. The third region of polycrystalline silicon is disposed between (i) the first region of polycrystalline silicon and (ii) the second region of polycrystalline silicon. Additionally, the method includes forming a first spacer region between (i) the first region of polycrystalline silicon and (ii) the third region of polycrystalline and forming a second spacer region between (i) the second region of polycrystalline silicon and (ii) the third region of polycrystalline silicon. The second spacer region includes the first dielectric material. Further, the method includes removing at least (i) the third region of polycrystalline silicon and (ii) at least a portion of the fin feature formed under the third region of polycrystalline silicon to thereby form a gap between (i) the first region of polycrystalline silicon and (ii) the second region of polycrystalline silicon and disposing a second dielectric material into the gap between (i) the first region of polycrystalline silicon and (ii) the second region of polycrystalline silicon to form an isolation component.

BRIEF DESCRIPTION OF THE DRAWINGS

Embodiments of the present disclosure will be readily understood by the following detailed description in conjunction with the accompanying drawings. To facilitate this description, like reference numerals designate like elements.

DETAILED DESCRIPTION

Described herein are example systems, components, and techniques directed to a semiconductor substrate having a fin feature that includes isolation components disposed between transistors formed from the semiconductor substrate, where the isolation components have minimal dimensions. For example, the isolation components can have a width less than 30 nm. The following description merely provides examples and is in no way intended to limit the disclosure, its application, or uses.

This disclosure is directed to isolation components formed between transistors on a semiconductor substrate having a fin feature that minimizes the size of the isolation components. Additionally, no electrical connections are made between the isolation components of embodiments described herein and other features of an integrated circuit. In this way, the density of transistors formed on the semiconductor substrate is maximized while minimizing any delay of the operation of the transistors caused by the isolation components. Further, the techniques described herein to form the isolation components maintain the contact between the polysilicon features and the semiconductor substrate. Thus, the processes used to embed stressors in the substrate are not inhibited by the lack of contact between polysilicon regions and the semiconductor substrate.

Figure 1:
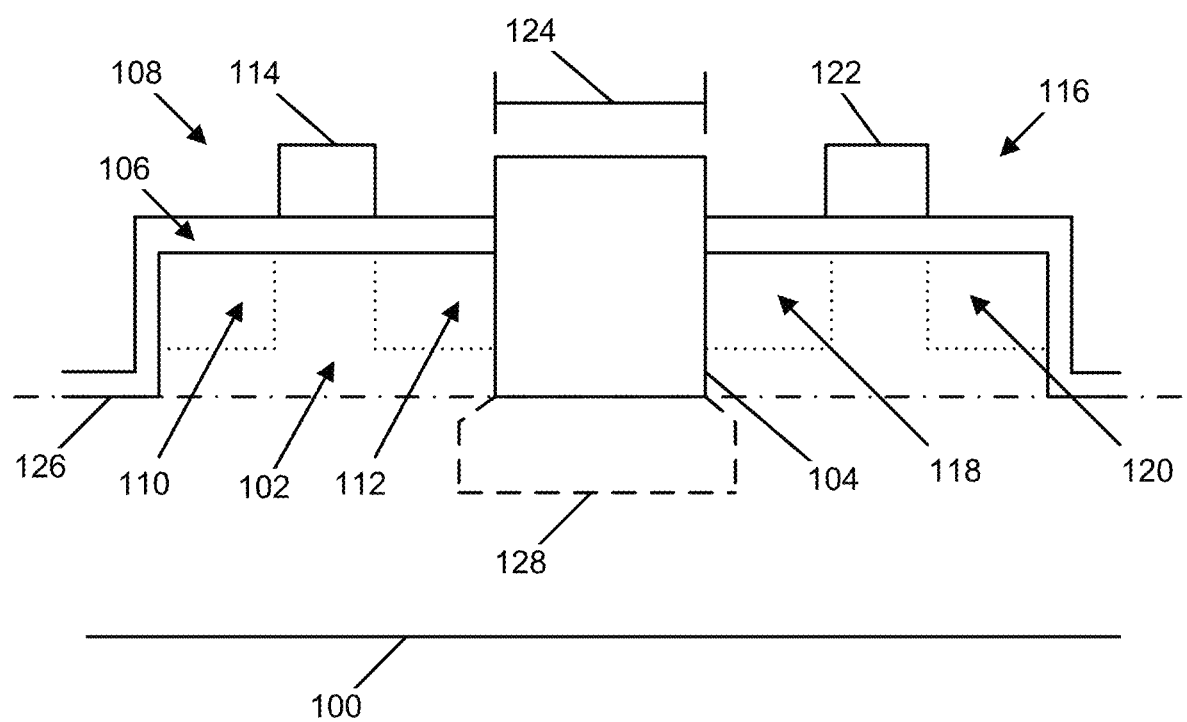
FIG. 1 illustrates a cross-sectional view of a semiconductor substrate including transistors formed from a fin feature of the semiconductor substrate and an isolation component formed between the transistors.

FIG. 1 illustrates a cross-sectional view of a portion of a semiconductor substrate 100 including transistors formed from a fin feature 102 of the semiconductor substrate 100 and an isolation region 104 formed between the transistors. In a particular embodiment, the transistors are included in an integrated circuit that can be utilized in an electronic device to perform various operations and functions, such as memory functions, processing functions, or both.

In one embodiment, the semiconductor substrate 100 includes silicon. In some embodiments, the semiconductor substrate 100 includes silicon and germanium. In some cases, a layer 106 is formed over a planar portion of the semiconductor substrate 100 that extends outward from the base of the fin feature 102. In an embodiment, the layer 106 includes a dielectric material. In a particular embodiment, the layer 106 includes an oxide. For example, the layer 106 can include silicon dioxide. In other cases, the layer 106 can include silicon nitride. In some cases, the semiconductor substrate 100 also includes embedded stressors, such as a silicon germanium stressor and/or a silicon carbide stressor.

In an embodiment, the fin feature 102 has a substantially rectangular shape. In these scenarios, the fin feature 102 has four sides extending vertically from a planar portion of the semiconductor substrate 100 and the fin feature 102 has a horizontal side on top of the four vertical sides that is substantially parallel with a planar portion of the semiconductor substrate 100. In other embodiments, the fin feature 102 has a different shape, such as a circular shape or a triangular shape.

A first transistor 108 is formed with the semiconductor substrate 100, where the first transistor 108 includes a first region 110, a second region 112, and a gate 114. In some embodiments, the first region 110 includes a source region and the second region 112 includes a drain region, while in other embodiments, the first region 110 includes a drain region and the second region 112 includes a source region. In an embodiment, the first region 110 and the second region 112 include doped regions of the semiconductor substrate 100. In some cases, the first region 110 and/or the second region 112 are doped with phosphorus. In other cases, the first region 110, the second region 112, or both are doped with arsenic. In an embodiment, the gate 114 includes polysilicon.

A second transistor 116 is also formed with the semiconductor substrate 100. The second transistor 116 includes a third region 118, a fourth region 120, and a gate 122. In an embodiment, the third region 118 includes a source region and the fourth region 120 includes a drain region. In other embodiments, the third region 118 includes a drain region and the fourth region 120 includes a source region. In some cases, the third region 118 and the fourth region 120 include a suitable dopant and the gate 122 includes polysilicon.

Further, the isolation component 104 is formed with the semiconductor substrate 100. The isolation component 104 has a width 124. In an embodiment, the width 124 is no greater than 30 nm, no greater than 25 nm, or no greater than 20 nm. In other embodiments, the width 124 is at least 5 nm, at least 10 nm or at least 15 nm. In an illustrative embodiment, the width 124 is included in a range of 6 nm to 29 nm. In another illustrative embodiment, the width 124 is included in a range of 9 to 18 nm.

In some cases, the isolation component 104 includes a dielectric material. In particular, the isolation component 104 includes a dielectric material that is different than a dielectric material of the layer 106. For example, the isolation component 104 can include a dielectric material that has a dielectric constant less than the dielectric constant of the layer 106. In an embodiment, a portion of the isolation region 104 includes air or another gas. To illustrate, a solid dielectric material can be used to form a cap on the isolation component 104, thus creating a cavity within the isolation region 104 that includes air or another gas. In some embodiments, the isolation component 104 extends below a plane 126 that defines a base of the fin feature 102. For example, the isolation region 104 can include an additional region 128.

Although, the illustrative example of FIG. 1 includes two transistors 108, 116 and one isolation component 104, any number of transistors and isolation components can be formed from the substrate 100.

Figure 2:
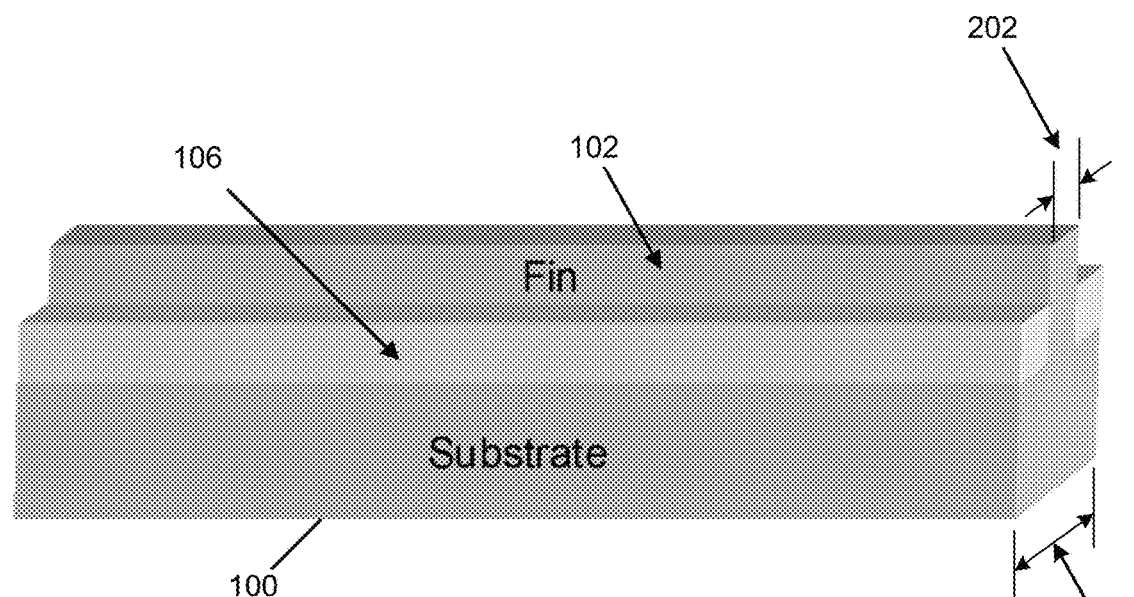
FIG. 2 illustrates an orthogonal view of a semiconductor substrate including a fin feature and an oxide layer formed on the semiconductor substrate.

FIG. 2 illustrates an orthogonal view of a semiconductor substrate 100 including a fin feature 102 and a layer 106 formed on the semiconductor substrate 100. The substrate 100, the fin feature 102, and the layer 106 are formed with a single patterning process using extreme ultraviolet (UV) radiation techniques. In addition, the substrate 100, the fin feature 102, and the layer 106 are formed with a single patterning process using electron beam techniques.

In a particular embodiment, the fin feature 102 is formed according to conventional techniques that can include depositing a stack of dielectric materials that includes one or more layers alternating layers of silicon nitride and silicon oxide on the substrate 100. In an illustrative embodiment, a layer of silicon nitride is formed at the top of a stack of dielectric materials followed by a layer of silicon dioxide, another layer of silicon nitride and an additional layer of silicon dioxide. In some embodiments, the formation of the fin feature 102 includes etching the top layer of silicon nitride according to a pattern and the deposition of polysilicon spacers adjacent to the remaining portions of the top layer of silicon nitride. Additional etching steps are then performed to form the fin feature 102. Subsequently, the layer 106 is formed by depositing a dielectric material, such as silicon dioxide, on the substrate 100 and the fin feature 102, followed by chemical mechanical polishing and a wet etch back. In an embodiment, the fin feature 102 can have a first thickness 202 that is less than a second thickness 204 of the substrate 100.

In some cases, self-aligned double patterning techniques can also be used to form a substrate with fin features that can be utilized with embodiments described herein. In these scenarios, a plurality of fins can be formed from the substrate 100.

Figure 3:
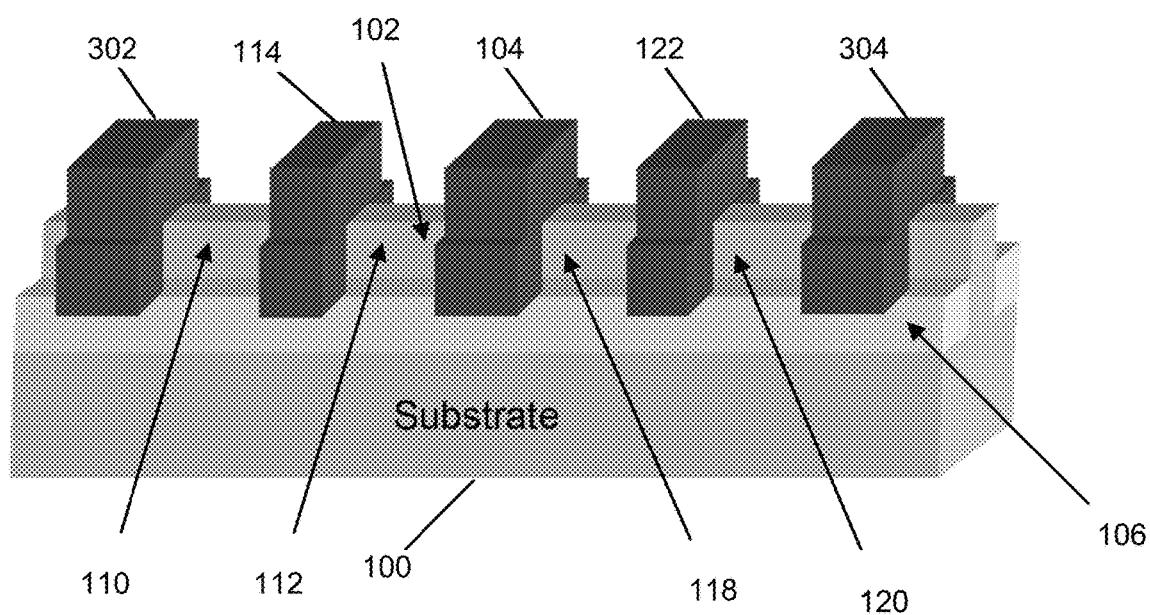
FIG. 3 illustrates an orthogonal view of a semiconductor substrate including a fin feature and a plurality of additional features formed over the fin feature.

FIG. 3 illustrates an orthogonal view of a semiconductor substrate 100 including a fin 102 feature and a plurality of additional features formed over the fin feature 102. In particular, a first gate 114 of a first transistor is formed over the fin feature 102 and a second gate 122 of a second transistor is formed over the fin feature 102. Additionally, a first isolation region 104, a second isolation region 302 and a third isolation region 304 is formed over the fin feature 102. In an embodiment, one or more of the first gate 114, the second gate 122, the first isolation region 104, the second isolation region 302, or the third isolation region 304 includes polysilicon. In an illustrative embodiment, one or more of the first gate 114, the second gate 122, the first isolation region 104, the second isolation region 302, or the third isolation region 304 are formed by depositing polysilicon over the fin feature 102 and/or the layer 106 via pyrolysis of silane under suitable conditions. In some cases, one or more of the first gate 114, the second gate 122, the first isolation region 104, the second isolation region 302, or the third isolation region 304 are formed according to a particular pattern.

In a particular embodiment, doped regions of the fin feature 102 form a source region or a drain region of transistors. For example, the region 110 and the region 112 can form a respective source region and a respective drain region for the gate 114 and the region 118 and the region 120 can form a respective source region and a respective drain region for the gate 122.

Figure 4:
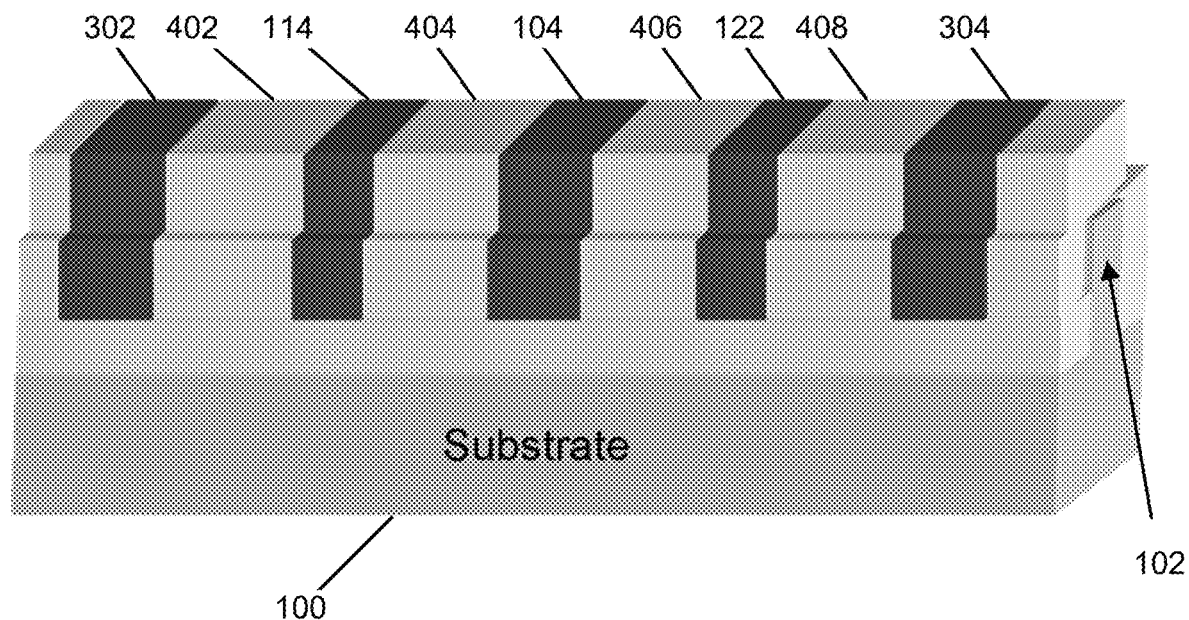
FIG. 4 illustrates an orthogonal view of a semiconductor substrate including a fin feature and a plurality of additional features formed over the fin feature and regions of dielectric material formed between the additional features.

FIG. 4 illustrates an orthogonal view of a semiconductor substrate 100 including a fin feature 102 and a plurality of additional features formed over the fin feature 102 and regions of dielectric material formed between the additional features. As shown in FIG. 4, one of the dielectric material regions (e.g. a spacer region 402) is formed over the fin feature 102 such than a bottom surface of the dielectric material region is formed over the fin feature 102 and includes a portion that is coplanar or in contact with a top surface of the layer 106 of dielectric material formed over the substrate 100. In particular, the first dielectric material region 402 is formed between the gate 114 and the second isolation region 302, a second dielectric material region 404 is formed between the gate 114 and the first isolation region 104, a third dielectric material region 406 is formed between the gate 122 and the first isolation region 104, and a fourth dielectric material region 408 is formed between the gate 122 and the third isolation region 304. The dielectric material regions 402, 404, 406, 408 can also be referred to herein as "spacer regions." In a particular embodiment, the dielectric material regions 402, 404, 406, 408 include an oxide. For example, the dielectric material regions 402, 404, 406, 408 can include silicon dioxide. In other embodiments, the dielectric material regions 402, 404, 406, 408 include a nitride. To illustrate, the dielectric material regions 402, 404, 406, 408 can include silicon nitride. In further embodiments, stressors are embedded in the dielectric material regions 402, 404, 406, 408, such as SiGe and/or SiC, to improve performance of the transistors formed from the substrate 100.

Figure 5:
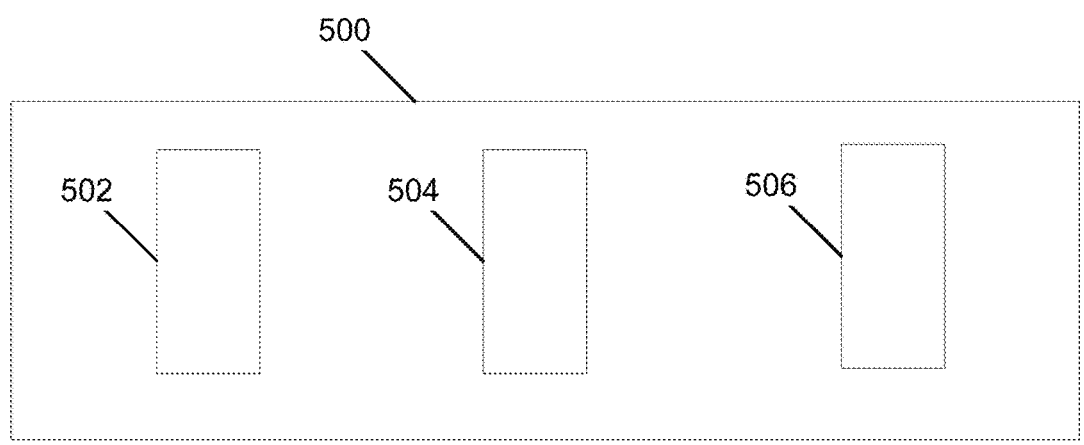
FIG. 5 illustrates a top view of a mask to place over a semiconductor substrate.

FIG. 5 illustrates a top view of a mask 500 to place over a semiconductor substrate, such as the substrate 100 of FIGS. 1-4. In the illustrative example of FIG. 5, the mask 500 includes a pattern having a first open portion 502, a second open portion 504, and a third open portion 506. The open portions 502, 504, 506 correspond with isolation regions of the substrate 100, such as the isolation regions 104, 302, 304 of FIG. 4. In some cases, the mask 500 includes an open portion to correspond with each isolation region of the substrate 100. In other cases, the number of open portions of the mask 500 are different from the number of isolation regions of the substrate 100. In some cases, the open portions 502, 504, 506 are larger than the isolation regions 104, 302, 304.

In an illustrative embodiment, the mask 500 is placed on top of the substrate 100 to remove material of the isolation regions of the substrate. In some cases, the material of the isolation regions of the substrate 100 is etched away according to the pattern of the mask 500. For example, using the mask 500 on the substrate 100 of FIG. 4, material of the isolation regions 104, 302, 304 is removed. The etchant is selected such that the material of the isolation regions 104, 302, 304 can be removed, while preserving the material of the dielectric material regions 402, 404, 406, 408. Furthermore, due to the pattern of the mask 500, the material of the gates 114 and 122 also remains intact.

Figure 6:
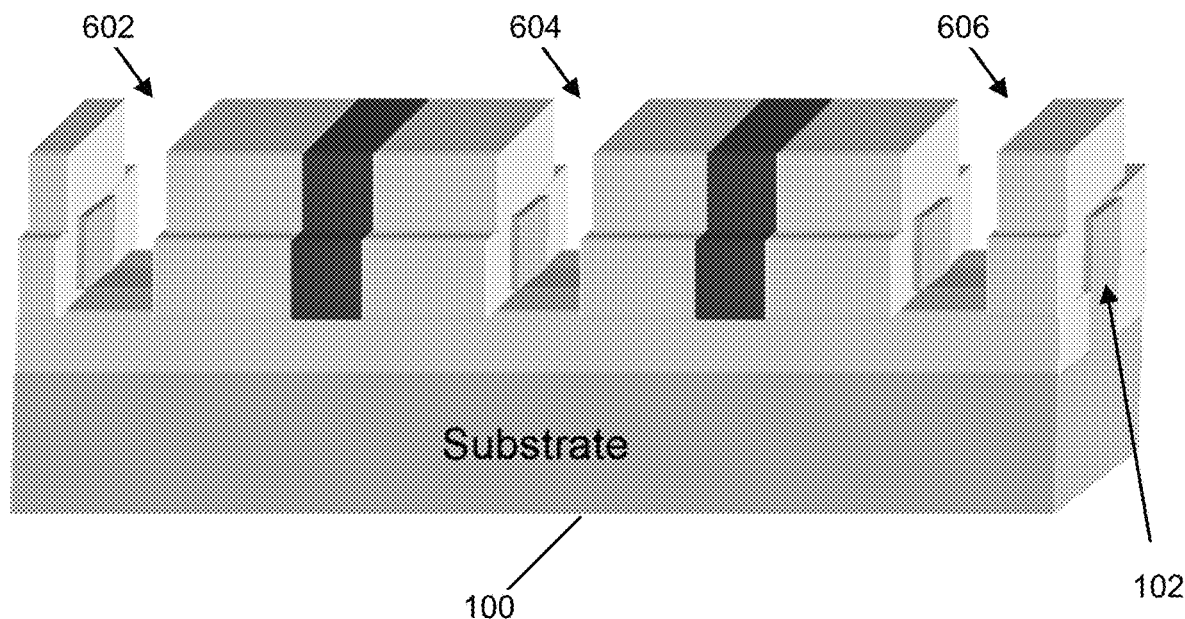
FIG. 6 illustrates an orthogonal view of a semiconductor substrate formed after placing a mask on the semiconductor substrate and etching portions of the semiconductor substrate exposed by the mask.

FIG. 6 illustrates an orthogonal view of a semiconductor substrate formed after placing a mask, such as the mask 500 of FIG. 5, on a semiconductor substrate, such as the semiconductor substrate 100 of FIG. 4, and etching the portions of the semiconductor substrate exposed by the mask 500. In the illustrative example of FIG. 6, the polysilicon material of the isolation regions is removed leaving gaps 602, 604, and 606. In addition, material of the fin feature 102 is also removed. In some cases, additional material of the substrate 100 is also removed to form a cavity beneath a plane formed by the base of the fin feature 102. In an embodiment, the removal of the additional material from the substrate 100 is achieved using an isotropic etch process. In some embodiments, using the mask 500 to remove material from the semiconductor substrate 100 aligns features of the semiconductor substrate and results in features of the semiconductor substrate 100 (e.g., gate regions, source regions, drain regions, etc.) having substantially consistent dimensions, and improves the performance of the transistors of the semiconductor substrate 100.

Figure 7:
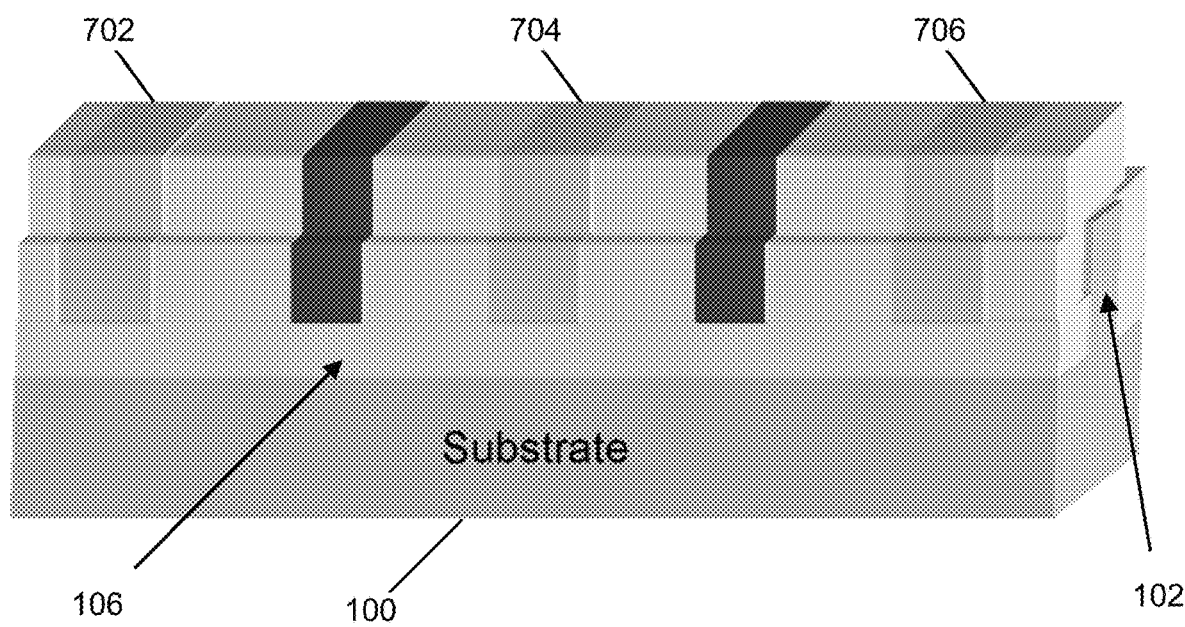
FIG. 7 illustrates an orthogonal view of a semiconductor substrate including isolation components disposed between transistors formed on the semiconductor substrate.

FIG. 7 illustrates an orthogonal view of a semiconductor substrate 100 including isolation components 702, 704, 706 between transistors formed on the semiconductor substrate 100. The isolation components 702, 704, 706 are formed by filling gaps left by removing the polysilicon of the corresponding isolation regions. In an illustrative example, the isolation components 702, 704, 706 are formed by filling the gaps 602, 604, 606 with a dielectric material. In some cases, the dielectric material of the isolation components 702, 704, 706 is different from the dielectric material of the layer 106. For example, the dielectric material of the isolation components 702, 704, 706 can have a lower dielectric constant than the dielectric constant of the layer 106.

In an embodiment, the isolation components 702, 704, 706 are partially filled with a dielectric material. For example, the one or more of the isolation components 702, 704, 706 can include a cavity that is surrounded by an amount of the dielectric material that comprises the dielectric regions. In some cases, the cavity is filled with a gas, such as air. In other embodiments, the isolation components 702, 704, 706 can be substantially filled with a dielectric material.

After forming the isolation components 702, 704, 706, one or more additional operations may be performed to form transistors from the substrate 100. For example a chemical mechanical polishing step can be performed to smooth surfaces of the transistors and the substrate 100. Further, forming contacts for trenches can be formed, silicides can be formed in the trenches, and metallization can be performed.

Although the embodiments described with respect to FIGS. 2 to 7 have been performed with respect to a bulk substrate, in some embodiments, the formation of the transistors and isolation regions described with respect to embodiments herein can be applied to silicon on insulator substrates. In silicon on insulator substrates, an oxide layer can be formed between the silicon on insulator substrate and the fin feature. The formation of fin features on silicon on insulator substrates can be formed according to suitable techniques.

Figure 8:
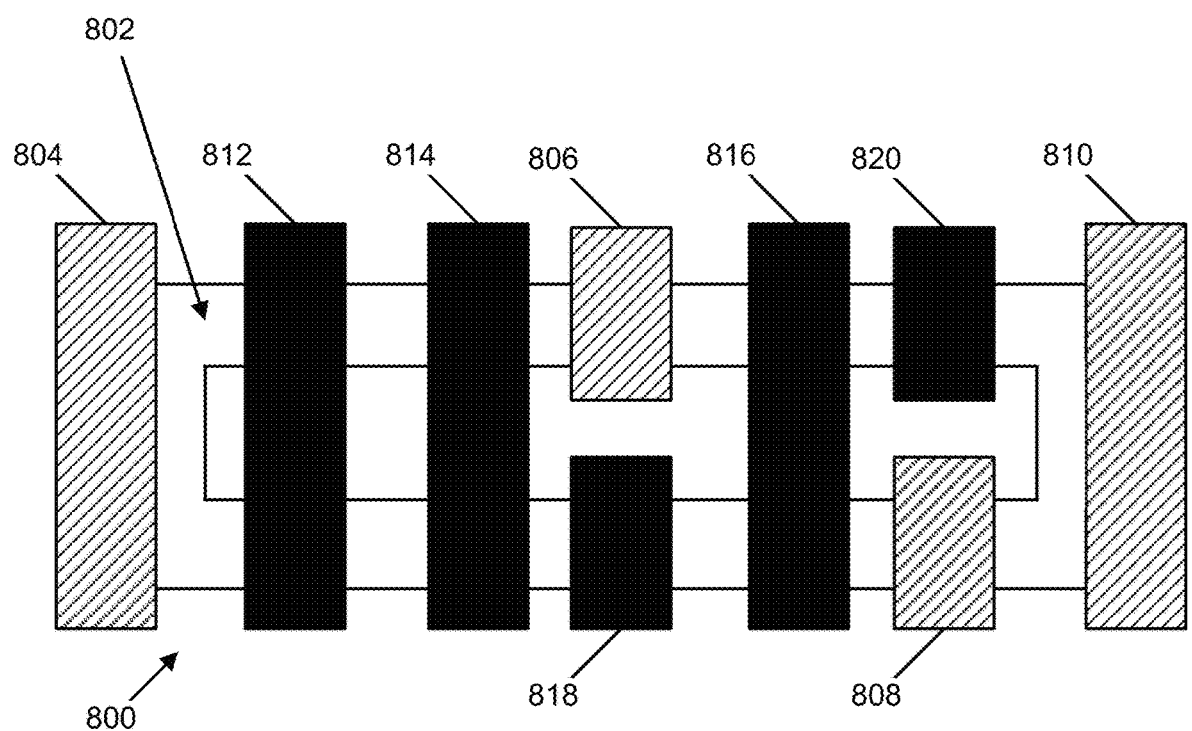
FIG. 8 illustrates a top view of an arrangement of features on a semiconductor substrate formed using a self-aligning double patterning process.

FIG. 8 illustrates a top view of an arrangement of features on a semiconductor substrate 800 formed using a self-aligning double patterning process. In particular, a fin region 802 is formed using a self-aligning double patterning process. Additionally, a number of isolation components 804, 806, 808, 810 are formed over the fin region 802. Further, gate regions 812, 814, 816, 818, 820 are also formed over the fin region 802. In an embodiment, the isolation components 804, 806, 808, 810 include a dielectric material and the gate regions 812, 814, 816, 818, 820 can include polysilicon.

In a particular embodiment, the isolation components 804, 806, 808, 810 are formed by depositing polysilicon over the fin region 802 according to a pattern and then etching away the polysilicon and at least a portion of a dielectric layer formed over the fin region 802. Subsequently, the gaps left in the substrate are filled with additional dielectric material. In some cases, at least a portion of the techniques described previously are used to form the isolation components 804, 806, 808, 810. In an illustrative embodiment, the mask used to etch away the polysilicon of the isolation regions also includes openings that can be used to perform a fin cut operation to form the gate regions 818 and 820. Thus, a single mask can be used to form the gaps that are filled to produce the isolation regions 804, 806, 808, 810 and to designate the portions of the substrate 800 that are cut to form the gate regions 818 and 820. In this way, misalignment between the isolation regions 804, 806, 808, 810 and the gate regions 812, 814, 816, 818, 820 and the size of source regions and drain regions of the substrate 800 can be more uniform than with conventional processes, which improves performance of transistors formed from the substrate 800.

Figure 9:
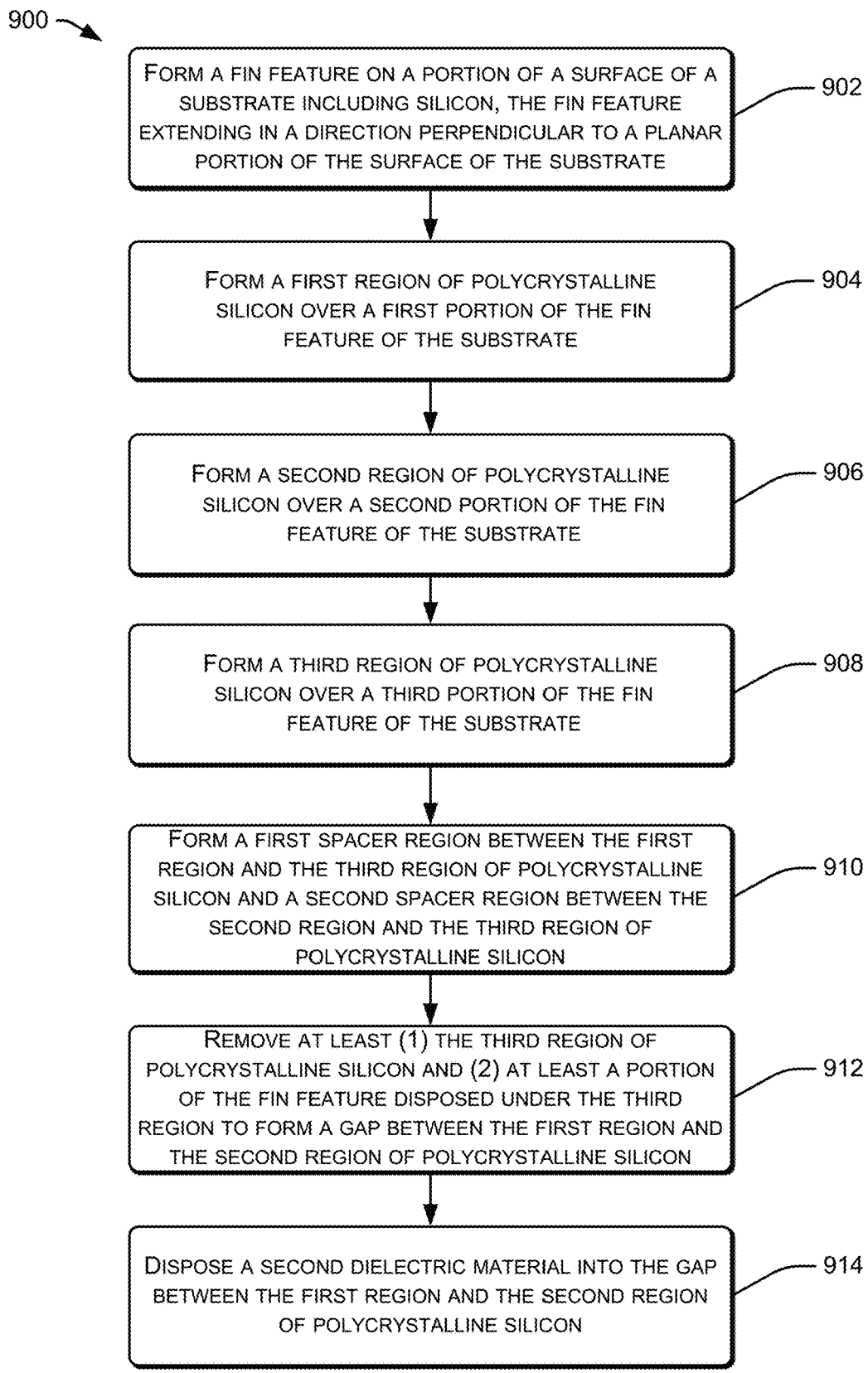
FIG. 9 illustrates a flow diagram of a process to form a semiconductor substrate having isolation components disposed between transistors formed from the semiconductor substrate having a fin feature.

FIG. 9 illustrates a flow diagram of a process 900 to form a semiconductor substrate having isolation components disposed between transistors formed from the semiconductor substrate having a fin feature. At 902, the process 900 includes forming a fin feature on a portion of a surface of a substrate including silicon. The fin feature extends in a direction that is perpendicular to a planar portion of the surface of the substrate. In an embodiment, the fin feature is formed using electron beam or extreme UV techniques. In other embodiments, a plurality of fin features is formed using self-aligning double patterning techniques.

At 904, the process 900 includes forming a first region of polycrystalline silicon over a first portion of the fin feature of the substrate. In addition, at 906, the process 900 includes forming a second region of polycrystalline silicon over a second portion of the fin feature of the substrate. Further, at 908, the process 900 includes forming a third region of polycrystalline silicon over a third portion of the fin feature of the substrate. The third region of polycrystalline silicon is disposed between the first region of polycrystalline silicon and the second region of polycrystalline silicon. In an embodiment, the first polycrystalline silicon region forms a gate of a first transistor and the third polycrystalline silicon region forms a gate of a second transistor.

At 910, the process 900 includes forming a first spacer region between the first region of polycrystalline silicon and the third region of polycrystalline silicon and a second spacer region between the second region of polycrystalline silicon and the third region of polycrystalline silicon. The first spacer region and the second spacer region include a first dielectric material. In some embodiments, stressor materials are embedded in the semiconductor substrate to improve the performance of the transistors after forming the first spacer region and the second spacer region. In some cases, the stressors include SiGe, SiC, or both into the substrate.

At 912, the process 900 includes removing at least the third region of polycrystalline silicon and at least a portion of the fin feature formed under the third region of polycrystalline silicon to form a gap between the first region of polycrystalline silicon and the second region of polycrystalline silicon. In an embodiment, the gap is formed by placing a mask over the substrate, where the mask includes an opening corresponding to a location of the third region of polycrystalline silicon. In some cases, the third region of polycrystalline silicon and at least a portion of fin feature are removed via etching while the mask is placed over the substrate. Additionally, a portion of the substrate below the fin feature can also be etched such that the gap extends below a plane formed by a planar surface of the substrate.

At 914, the process 900 includes disposing a second dielectric material into the gap between the first region of polycrystalline silicon and the second region of polycrystalline silicon to form an isolation region. In an embodiment, the isolation region has a width that is less than 30 nm. Additionally, in some cases, the first dielectric material is different from the second dielectric material. In particular, the first dielectric material has a dielectric constant with a value that is greater than the dielectric constant of the second dielectric material.

Further aspects of the present invention also relate to one or more of the following clauses.

Clause 1. An apparatus comprising: a substrate including a surface, wherein the surface includes a planar portion, and a fin feature extending in a direction substantially perpendicular to the planar portion and having a thickness less than a thickness of the substrate; a first transistor, wherein the first transistor includes a first gate region formed over the fin feature, a first source region formed from a body of the fin feature, and a first drain region formed from the body of the fin feature; a second transistor, wherein the second transistor includes a second gate region formed over the fin feature, a second source region formed from the body of the fin feature, and a second drain region formed from the body of the fin feature; and an isolation component formed between the first transistor and the second transistor, wherein the isolation component has a width less than 30 nm.

Clause 2. The apparatus of clause 1, wherein: the fin feature has a substantially rectangular shape; the fin feature includes four sides extending in the direction substantially perpendicular to the planar portion; and the fin feature includes an additional side substantially parallel to the planar portion.

Clause 3. The apparatus of clause 1, wherein: the first drain region of the first transistor is adjacent to the isolation component; and the second source region of the second transistor is adjacent to the isolation component.

Clause 4. The apparatus of clause 1, wherein the width of the isolation component is in a range of 9 nm to 18 nm.

Clause 5. The apparatus of clause 1, wherein: a layer is disposed on the planar portion of the surface of the substrate; the layer includes a first dielectric material; and the isolation component includes a second dielectric material.

Clause 6. An apparatus comprising: a substrate including a surface, wherein the surface includes a planar portion, and a fin feature extending in a direction substantially perpendicular to the planar portion and having a thickness less than a thickness of the substrate; a layer formed over the planar portion of the surface of the substrate, wherein the layer includes a first dielectric material; a first transistor, wherein the first transistor includes a first gate region disposed on at least two sides of the fin feature, a first source region formed from a body of the fin feature, and a first drain region formed from the body of the fin feature; a second transistor, wherein the second transistor includes a second gate region formed on the at least two sides of the fin feature, a second source region formed from the body of the fin feature, and a second drain region formed from the body of the fin feature; and an isolation component formed between the first transistor and the second transistor, wherein the isolation component includes a second dielectric material that is different from the first dielectric material.

Clause 7. The apparatus of clause 6, wherein the first dielectric material has a dielectric constant with a value greater than a value of the dielectric constant of the second material.

Clause 8. The apparatus of clause 6, wherein the first dielectric material includes one of $SiO_2$ or SiN.

Clause 9. The apparatus of clause 6, wherein the isolation component includes a third dielectric material that is different from (i) the first dielectric material and (ii) the second dielectric material.

Clause 10. The apparatus of clause 9, wherein: the isolation component includes a cavity filled with the third dielectric material; and the cavity is encased by at least the second dielectric material.

Clause 11. The apparatus of clause 6, wherein the isolation component has a width in a range of 6 nm to 29 nm.

Clause 12. The apparatus of clause 6, wherein the substrate includes an additional fin feature, and wherein the substrate further includes: a third transistor, wherein the third transistor includes a third gate region disposed on at least two sides of the additional fin feature, a third source region formed from a body of the additional fin feature, and a third drain region formed from the body of the fin feature; a fourth transistor, wherein the fourth transistor includes a fourth gate region disposed on the at least two sides of the additional fin feature, a fourth source region formed from the body of the additional fin feature, and a fourth drain region formed from the body of the additional fin feature; and an additional isolation component formed between the third transistor and the fourth transistor.

Clause 13. A method comprising: forming a fin feature on a portion of a surface of a substrate including silicon, wherein the fin feature extends in a direction perpendicular to a planar portion of the surface of the substrate; forming a first region of polycrystalline silicon over a first portion of the fin feature of the substrate; forming a second region of polycrystalline silicon over a second portion of the fin feature of the substrate; forming a third region of polycrystalline silicon over a third portion of the fin feature of the substrate, wherein the third region of polycrystalline silicon is disposed between (i) the first region of polycrystalline silicon and (ii) the second region of polycrystalline silicon; forming a first spacer region between (i) the first region of polycrystalline silicon and (ii) the third region of polycrystalline silicon, wherein the first spacer region includes a first dielectric material; forming a second spacer region between (i) the second region of polycrystalline silicon and (ii) the third region of polycrystalline silicon, wherein the second spacer region includes the first dielectric material; removing at least (i) the third region of polycrystalline silicon and (ii) at least a portion of the fin feature formed under the third region of polycrystalline silicon to thereby form a gap between (i) the first region of polycrystalline silicon and (ii)

the second region of polycrystalline silicon; and disposing a second dielectric material into the gap between (i) the first region of polycrystalline silicon and (ii) the second region of polycrystalline silicon to form an isolation component.

Clause 14. The method of clause 13, further comprising: placing a mask over the substrate, wherein the mask includes an opening corresponding to a location of the third region of polycrystalline silicon; and etching (i) the third region of polycrystalline silicon and (ii) the at least a portion of fin feature according to a pattern of the mask.

Clause 15. The method of clause 14, further comprising etching a portion of the substrate such that the gap extends below a surface of the planar portion of the surface of the substrate.

Clause 16. The method of clause 13, further comprising: forming an additional fin feature on the substrate, wherein both (i) the fin feature and (ii) the additional fin feature are formed using a self-aligning double patterning process.

Clause 17. The method of clause 13, wherein a width of the isolation component is less than 30 nm.

Clause 18. The method of clause 13, wherein the first dielectric material is different from the second dielectric material.

Clause 19. The method of clause 13, wherein: the first polycrystalline silicon region forms a gate of a first transistor; and the third polycrystalline silicon region forms a gate of a second transistor.

Clause 20. The method of clause 13, further comprising: after forming the first spacer region and the second spacer region, embedding stressor materials into the substrate, wherein the stressor materials include one or both of SiGe and/or SiC.

Note that the description above incorporates use of the phrases "in an embodiment," or "in various embodiments," or the like, which may each refer to one or more of the same or different embodiments. Furthermore, the terms "comprising," "including," "having," and the like, as used with respect to embodiments of the present disclosure, are synonymous.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This application is intended to cover any adaptations or variations of the embodiments discussed herein. Therefore, it is manifestly intended that embodiments in accordance with the present disclosure be limited only by the claims and the equivalents thereof.

What is claimed is:

1. An apparatus comprising:
a substrate having a surface that includes a planar portion and a fin feature that extends from the surface of the substrate in a direction that is perpendicular to the planar portion of the surface;
a dielectric layer formed over the planar portion of the surface of the substrate that extends outward from the fin feature of the substrate;
a first region of polycrystalline silicon formed over a first portion of the fin feature of the substrate;
a second region of polycrystalline silicon formed over a second portion of the fin feature of the substrate;
a gap formed through the fin feature, the gap formed between the first region of polycrystalline silicon and the second region of polycrystalline silicon;
a first spacer region formed between the first region of polycrystalline silicon and the gap formed through the fin feature, the first spacer region formed of a first dielectric material and over the fin feature, a bottom surface of the first spacer region formed over the fin feature and having a portion that is coplanar with a top surface the dielectric layer;
a second spacer region formed between the second region of polycrystalline silicon and the gap formed through the fin feature, the second spacer region formed of the first dielectric material and over the fin feature, a bottom surface of the second spacer region formed over the fin feature and having a portion that is coplanar with the top surface of the dielectric layer; and
an isolation component formed in the gap formed through the fin feature and between the first spacer region and the second spacer region, wherein:
the isolation component is formed from one or more other dielectric materials that fill (i) the gap formed through the fin feature of the substrate and (ii) a volume of space between the first spacer region and the second spacer region,
the isolation component is formed adjacent to at least one of the first spacer region or the second spacer region without another component being disposed between the isolation component and the at least one of the first spacer region or the second spacer region, and
the one or more dielectric materials of the isolation component comprise at least a second dielectric material having a dielectric constant that is less than a dielectric constant of the dielectric layer formed over the planar portion of the surface of the substrate.

2. The apparatus as recited in claim 1, wherein the gap formed through the fin feature extends below a surface of the planar portion of the substrate such that at least a portion of the isolation component extends below the surface of the planar portion.

3. The apparatus as recited in claim 1, wherein the first dielectric material from which the first spacer region and second spacer region are formed is different from the second dielectric material from which the isolation component is formed.

4. The apparatus as recited in claim 1, wherein the first dielectric material from which the first spacer region and second spacer region are formed has a dielectric constant that is less than the dielectric constant of the second dielectric material from which the isolation component is formed.

5. The apparatus as recited in claim 1, wherein:
the first spacer region is formed adjacent to a first side of the isolation component without another component being disposed between the first spacer region and the isolation component;
the second spacer region is formed adjacent to a second side of the isolation component without another component being disposed between the second spacer region and the isolation component; and
the first spacer region or the second spacer region is formed over a portion of the fin feature that extends between the isolation component and the first region of polycrystalline silicon or the second region of polycrystalline silicon, respectively.

6. The apparatus as recited in claim 1, wherein:
the first region of polycrystalline silicon forms a gate of a first transistor of the apparatus;
the first spacer region is formed over a source of the first transistor or a drain of the first transistor;
the second region of polycrystalline silicon forms a gate of a second transistor of the apparatus; or the second spacer region is formed over a source of the second transistor or a drain of the second transistor.

7. The apparatus as recited in claim 1, wherein the first spacer region or the second spacer region includes a stressor material comprising at least one of silicon-germanium (SiGe) or silicon carbide (SiC).

8. The apparatus as recited in claim 1, wherein the dielectric layer formed over the planar portion of the surface comprises one of silicon dioxide (SiO2) or silicon nitride (SN).

9. The apparatus as recited in claim 1, wherein the one or more dielectric materials of the isolation component comprise air or gas that occupy one or more cavities formed in the isolation component.

10. The apparatus as recited in claim 1, wherein a width of the isolation component formed in the gap of the fin feature is between 5 nanometers and 30 nanometers.

11. An apparatus comprising:
a substrate having a surface that includes a planar portion and a fin feature that extends from the surface of the substrate in a direction that is perpendicular to the planar portion of the surface;
a dielectric layer formed over the planar portion of the surface of the substrate that extends outward from the fin feature of the substrate, the dielectric layer formed from a first dielectric material;
a first transistor that includes:
a first gate formed over the fin feature of the surface;
a first source formed in the fin feature of the surface;
a first drain formed in the fin feature of the surface;
a second transistor that includes:
a second gate formed over the fin feature of the surface;
a second source formed in the fin feature of the surface;
a second drain formed in the fin feature of the surface;
a gap formed through the fin feature of the surface, the gap formed between the first transistor and the second transistor;
a first spacer region formed between the first gate of the first transistor and the gap, the first spacer region formed of a second dielectric material and over the fin feature, a bottom surface of the first spacer region including a portion that is coplanar with the dielectric layer formed over the planar portion of the surface of the substrate;
a second spacer region formed between the second gate of the second transistor and the gap, the second spacer region formed of the second dielectric material and over the fin feature, a bottom surface of the second spacer region including a portion that is coplanar with the dielectric layer formed over the planar portion of the surface of the substrate; and
an isolation component formed between the first transistor and second transistor of the apparatus, the isolation component formed in the gap formed through the fin feature, wherein:
the isolation component is formed from one or more other dielectric materials that fill (i) the gap in the fin feature of the substrate and (ii) a volume of space between the first transistor and the second transistor,
the isolation component is formed adjacent to at least one of the first spacer region or the second spacer region without another component being disposed between the isolation component the at least one of the first spacer region or the second spacer region, and
the one or more dielectric materials of the isolation component comprise at least a third dielectric material having a dielectric constant that is less than a dielectric constant of the first dielectric material of the dielectric layer formed over the planar portion of the surface of the substrate.

12. The apparatus as recited in claim 11, wherein the gap in the fin features extends below a surface of the planar portion of the substrate such that at least a portion of the isolation component extends below the surface of the planar portion.

13. The apparatus as recited in claim 11, wherein:
the first spacer region is formed over the first source or the first drain;
the second spacer region is formed over the second source or the second drain; and
the second dielectric material from which the first and second spacer regions are formed is different from the third dielectric material from which the isolation component is formed.

14. The apparatus as recited in claim 11, wherein:
the first spacer region is formed over the first source or the first drain;
the second spacer region is formed over the second source or the second drain; and
the second dielectric material from which the first and second spacer regions are formed has a dielectric constant that is less than the dielectric constant of the third dielectric material from which the isolation component is formed.

15. The apparatus as recited in claim 11, wherein:
the first source or the first drain of the first transistor includes a first doped portion of the fin feature that is adjacent to the isolation component without another component being disposed between the first transistor and the isolation component; or
the second source or the second drain of the second transistor includes a second doped portion of the fin feature that is adjacent to the isolation component without another component being disposed between the second transistor and the isolation component.

16. The apparatus as recited in claim 11, wherein one of the first gate of the first transistor or the second gate of the second transistor is formed with polycrystalline silicon.

17. The apparatus as recited in claim 11, wherein:
the first spacer region or the second spacer region includes a stressor material comprising at least one of a silicon-germanium (SiGe) and silicon carbide (SiC).

18. The apparatus as recited in claim 11, wherein the dielectric layer formed over the planar portion of the surface comprises one of silicon dioxide (SiO2) or silicon nitride (SN).

19. The apparatus as recited in claim 11, wherein the one or more dielectric materials of the isolation component further comprise air or gas that occupy one or more cavities formed in the isolation component.

20. An integrated circuit comprising:
a first transistor formed on a first portion of a fin feature of a substrate that includes a planar portion from which the fin feature extends in a direction that is perpendicular to the planar portion, the planar portion supporting a layer of first dielectric material disposed over the planar portion and below the first transistor, the layer of first dielectric material extending outward from the fin feature of the substrate;
a second transistor formed on a second portion of the fin feature of the substrate that includes the planar portion from which the fin feature extends in the direction that is perpendicular to the planar portion, the planar portion supporting the layer of first dielectric material disposed over the planar portion and below the second transistor, the layer of the first dielectric material extending outward from the fin feature of the substrate;

a gap formed through the fin feature and between the first transistor and the second transistor formed on the fin feature of the substrate;

a first spacer region formed between the first gate of the first transistor and the gap, the first spacer region formed over the fin feature with a bottom surface that includes a portion that is coplanar with a top surface of the layer of the first dielectric material;

a second spacer region formed between the second gate of the second transistor and the gap, the second spacer region formed over the fin feature with a bottom surface that includes a portion that is coplanar with the top surface of the layer of the first dielectric material; and an isolation component formed between the first transistor and second transistor of the integrated circuit, the isolation component formed in the gap of the fin feature, wherein:

the isolation component is formed from one or more other dielectric materials that fill (i) the gap in the fin feature of the substrate and (ii) a volume of space between the first transistor and the second transistor, the isolation component is formed adjacent to at least one of the first spacer region or the second spacer region without another component being disposed between the isolation component the at least one of the first spacer region or the second spacer region, and the one or more dielectric materials of the isolation component comprise at least a second dielectric material having a dielectric constant that is less than a dielectric constant of the layer of first dielectric material disposed over the planar portion and below the first transistor and second transistor of the integrated circuit.

* * * * *